(12) United States Patent
De Rossi et al.

(10) Patent No.: US 9,586,437 B2
(45) Date of Patent: Mar. 7, 2017

(54) METHOD FOR PRODUCING COATING SYSTEMS CONTAINING METAL LAYERS FOR FINISHING PLASTIC SURFACES

(71) Applicant: MANKIEWICZ GEBR. & CO. GMBH & CO. KG, Hamburg (DE)

(72) Inventors: Umberto De Rossi, Norderstedt (DE); Klaus Roths, Zuffenhausen (DE)

(73) Assignee: MANKIEWICZ GEBR. & CO. GMBH & CO. KG, Hamburg (DE)

( * ) Notice: Subject to any disclaimer, the term of this patent is extended or adjusted under 35 U.S.C. 154(b) by 0 days.

(21) Appl. No.: 14/364,674

(22) PCT Filed: Dec. 10, 2012

(86) PCT No.: PCT/DE2012/001177
§ 371 (c)(1),
(2) Date: Jun. 12, 2014

(87) PCT Pub. No.: WO2013/087058
PCT Pub. Date: Jun. 20, 2013

(65) Prior Publication Data
US 2014/0370254 A1   Dec. 18, 2014

(30) Foreign Application Priority Data
Dec. 14, 2011  (DE) .................. 10 2011 120 940

(51) Int. Cl.
| | |
|---|---|
| *B44F 1/02* | (2006.01) |
| *C23C 14/00* | (2006.01) |
| *C23C 14/02* | (2006.01) |
| *B41M 5/00* | (2006.01) |
| *B41M 7/00* | (2006.01) |
| *C08J 7/04* | (2006.01) |
| *C08J 7/06* | (2006.01) |
| *C09D 11/101* | (2014.01) |
| *C09D 11/322* | (2014.01) |
| *B05D 7/00* | (2006.01) |
| *C23C 14/34* | (2006.01) |
| *B05D 5/06* | (2006.01) |
| *B05D 3/06* | (2006.01) |

(52) U.S. Cl.
CPC ............... *B44F 1/02* (2013.01); *B05D 5/068* (2013.01); *B05D 7/574* (2013.01); *B41M 5/0047* (2013.01); *B41M 7/0045* (2013.01); *B41M 7/0081* (2013.01); *C08J 7/045* (2013.01); *C08J 7/06* (2013.01); *C09D 11/101* (2013.01); *C09D 11/322* (2013.01); *C23C 14/00* (2013.01); *C23C 14/024* (2013.01); *C23C 14/34* (2013.01); *B05D 3/067* (2013.01); *B05D 7/53* (2013.01); *B41M 5/007* (2013.01); *B41M 5/0064* (2013.01); *C08J 2333/00* (2013.01); *Y10T 428/24917* (2015.01)

(58) Field of Classification Search
CPC ........ B05D 3/067; B05D 5/068; B05D 7/576; B41M 5/0047; B41M 7/0045; B41M 7/0081; B44F 1/02; C09D 11/101; C09D 11/322; C23C 14/00; C23C 14/34
See application file for complete search history.

(56) References Cited

U.S. PATENT DOCUMENTS

| | | |
|---|---|---|
| 6,155,689 A | 12/2000 | Smith |
| 7,297,397 B2 * | 11/2007 | Leininger .............. B05D 5/068 427/402 |
| 2005/0219626 A1 | 10/2005 | Moncrieff |
| 2011/0274891 A1 | 11/2011 | De Rossi et al. |
| 2012/0003489 A1 * | 1/2012 | Ying ............................ 428/469 |
| 2014/0161986 A1 | 6/2014 | De Rossi et al. |

FOREIGN PATENT DOCUMENTS

| | | |
|---|---|---|
| DE | 10 2008 063 837 A1 | 6/2010 |
| JP | 56-41374 A | 4/1981 |
| JP | 2005-134610 A | 5/2005 |
| JP | 2007001247 A * | 1/2007 |
| JP | 2011-152774 A | 8/2011 |
| WO | WO 99/31534 A1 | 6/1999 |
| WO | WO 2008/035186 A1 | 3/2008 |

\* cited by examiner

*Primary Examiner* — Shamim Ahmed
*Assistant Examiner* — Bradford Gates
(74) *Attorney, Agent, or Firm* — Norman B. Thot

(57) ABSTRACT

A method for coating a surface of a structural component includes applying at least one ink to the surface of the structural component via an inkjet process. The at least one ink applied is irradiated with UV radiation so as to cure the at least one ink and to form an ink-containing layer. At least one metal layer is applied to the ink-containing layer via a PVD procedure. At least one clear lacquer is applied to the at least one metal layer. The at least one clear lacquer is cured so as to form a clear lacquer layer.

4 Claims, No Drawings

METHOD FOR PRODUCING COATING SYSTEMS CONTAINING METAL LAYERS FOR FINISHING PLASTIC SURFACES

CROSS REFERENCE TO PRIOR APPLICATIONS

This application is a U.S. National Phase application under 35 U.S.C. §371 of International Application No. PCT/DE2012/001177, filed on Dec. 10, 2012 and which claims benefit to German Patent Application No. 10 2011 120 940.2, filed on Dec. 14, 2011. The International Application was published in German on Jun. 20, 2013 as WO 2013/087058 A1 under PCT Article 21(2).

FIELD

The present invention relates to a method for producing a coating system for the refinement and decoration of structural components, which coating system can be used in in-line processes. The present invention further relates to coating systems for synthetic surfaces, which coating systems contain one or more metal layers.

BACKGROUND

As vacuum-based coating methods, known methods of applying metal layers to the surfaces of substrates are physical gas deposition methods or PVD (Physical Vapor Deposition) methods. The starting material, that is to say, the coating material is thereby converted to the gas phase with the aid of physical methods. The gaseous material condenses on the substrate to be coated, thereby forming the target layer or coating. Various methods are used to vaporize the starting material. The starting material can, for example, be converted to the gas phase by cathode deposition or sputtering. The term "sputtering" is hereafter understood to mean "sputter deposition", which is commonly used to produce thin layers. Sputtering of thin layers is employed, for example, to refine surfaces.

The very low process temperatures of PVD coating methods make it possible to use low melting plastics materials. The surface of a plastics substrate or plastics structural component is not, however, usually sufficiently free of flaws. A primer must therefore usually be applied beneath the PVD layer. Two-component solvent-based primers are usually used for this purpose, such as polyurethane primers, which require thermal drying. The usual drying conditions are 80° C. over a period of 30 minutes. A thermally drying primer is not, however, suitable for the build-up of relief structures. A metal layer applied by means of the PVD process is moreover not sufficiently mechanically stable for some applications, such as in the interior of an automobile. For this reason, another layer is usually applied to the metal layer, for example, a clear lacquer.

The metal layer is also difficult to decorate via the known coating systems. The application of patterns or characters is only possible via a laser treatment of the clear lacquer. Laser writing is, however, expensive and spoils or damages the surface of the clear lacquer. Laser treatment also leads to the formation of open edges, which in a moist atmosphere can be the cause of infiltration, as a result of which the entire structure of the coating is weakened. The additional laser treatment is not possible in in-line processing. This method also cannot reproduce any relief structures.

SUMMARY

An aspect of the present invention is to provide improved means and methods for the surface refinement of structural component parts, in particular, coating methods and coating systems containing a metallic layer.

In an embodiment, the present invention provides a method for coating a surface of a structural component which includes applying at least one ink to the surface of the structural component via an inkjet process. The at least one ink applied is irradiated with UV radiation so as to cure the at least one ink and to form an ink-containing layer. At least one metal layer is applied to the ink-containing layer via a PVD procedure. At least one clear lacquer is applied to the at least one metal layer. The at least one clear lacquer is cured so as to form a clear lacquer layer. The present invention also provides a coating system for a substrate surface which includes an ink-containing layer comprising at least one UV curing inkjet ink, at least one metal layer, and a clear lacquer layer comprising at least one clear lacquer.

DETAILED DESCRIPTION

The method according to the present invention comprises a number of steps for providing a coating system directly on the surface of a structural component. An ink-bearing layer is firstly applied to the surface of the structural component. The surface can be coated directly or may first be provided with an undercoat or primer layer. A metal layer is then placed over the ink-bearing layer. Finally, a clear lacquer layer is applied to the metal layer.

According to the present invention, the first layer comprises one or more UV-curing inks. For this purpose, at least one ink is applied to the surface of the structural component by a conventional ink jet printing method using a commercially available ink-jet printing head. The term "ink-jet printing method" should be understood to mean both ink-jet and drop-on-demand methods. The applied inks are cured by means of irradiation by ultraviolet light so as to form the ink-containing layer. By the use of UV-curing inks in the inkjet printing method, it is also possible to obtain a relief-like surface layer on this first layer in the usual manner known to the person skilled in the art. In combination with the overlying metal layer a light and shadow effect result on the surface of the structural component.

Known inkjet inks are low-viscosity inks, usually water-based or solvent-based, having a viscosity ranging from 4 to 30 mPas. In addition to their content of colorant, these inks have a high solvent content and a low binder content. The colorants used are, for example, soluble dyes showing high light fastness and heat stability and/or finely divided pigments having a particle size of less than 3 µm. UV-curing inkjet inks suitable for use in the method of the present invention include oligomers, reactive diluents, and photoinitiators, which trigger the curing process.

A thin metal layer is applied to the first, ink-containing layer. According to the present invention, this metal layer is produced by PVD processes, for example, via sputtering or vaporization. Suitable metals for the coating are, for example, aluminum and chromium. In an embodiment of the present invention, the color of the metal layer can be changed by the use of reactive gases.

A layer of clear lacquer is then formed on the metal layer. The clear lacquer is applied to the metal layer and cured. By "clear lacquer" is meant a coating material that forms a transparent layer or coating on a surface and has mainly protective properties. Clear lacquers usually have no content of pigments or fillers. If desired, soluble dyes or transparent pigments may be added thereto. Clear lacquers suitable for the method of the present invention are known to the person skilled in the art. UV-curing lacquers can, for example, be used. Unlike the UV-curing inks, the clear lacquers have significantly higher binder contents for the purpose of increasing the stability of the cured layer. They are also applied in thicker layers than the inks. The clear lacquers can be applied in any one of a number of methods familiar to the person skilled in the art, such as brush coating, airbrush coating, spatter coating, spray coating, squeegee or knife coating, and roller coating. In the present invention, the clear lacquers can, for example, be applied using spray guns. In an embodiment of the method, the clear lacquers can, for example, be applied by an inkjet printing procedure.

In an embodiment of the present invention, a primer can, for example, first be applied to the structural component surface. According to the present invention, the first layer is printed over this primer to give the desired pattern or decoration using at least one suitable ink printed by means of a commercially available inkjet printing head. The undercoat or primer layer of the present invention serves to improve the adhesion of the overall coating system to the surface of the structural component. The primers that can be employed and are generally employed for priming the material of the structural component are well known to the person skilled in the art. Use can, for example, be made of UV-curing primers, which are applied to the surface of the structural component by any conventional method, such as brush coating, airbrush coating, spatter coating, spray coating, squeegee or knife coating, or roller coating. According to the present invention, the primers can, for example, be applied by the use of spray guns. In an embodiment of the method, the primers can, for example be applied by means of an ink jet printing procedure.

The method of the present invention can, for example, be used to coat structural component parts. Suitable structural component materials or substrates are plastics materials, such as normal ABS (copolymer of acrylonitrile, butadiene, and styrene), or ABS-PC (copolymer of acrylonitrile, butadiene, and styrene containing polycarbonates). Other suitable substrates are glass and melamine, such as melamine laminates or melamine-faced materials. The coating method of the present invention makes it possible to decorate the metal layer without damaging the top layer so that no destabilization of the overall structure occurs. The resulting coatings therefore exhibit resistance properties that satisfy the usual automotive specifications.

UV-curing inks, lacquers and primers which can, for example, be used in the method of the present invention cure relatively quickly so that faster post-treatment of the coated surfaces is possible. The method can therefore be readily integrated in existing painting processes and thus offers the possibility of in-line finishing.

The present invention provides a coating system having the following layer configuration:
  a first ink-containing layer comprising one or more UV curing inkjet inks,
  one or more metal layers, and
  a final clear layer comprising one or more lacquers.

In an embodiment of the present invention, the inks used contain from 5 to 50% by weight of oligomers, from 20 to 80% by weight of reactive thinners, and up to 15% by weight of pigments, in each case based on the total weight of the ink. The ink can, for example, contain from 5 to 30% by weight of oligomer, for example, from 5 to 15% by weight of oligomer, based on the total weight of the ink. Suitable oligomers include, for example, aliphatic and aromatic urethane acrylates, polyether acrylates, and epoxy acrylates, which acrylates can be monofunctional or polyfunctional, for example, difunctional, trifunctional to hexafunctional and decafunctional. The inks can, for example, contain from 50 to 80% and, for example, from 70 to 80%, by weight, of monofunctional, difunctional and/or trifunctional reactive thinners, based on the total weight of the ink. Suitable reactive diluents are, for example, dipropylene glycol, tripropylene glycol diacrylate, tetrahydrofurfuryl acrylate, isobornyl acrylate and isodecyl acrylate. The inks used in the method of the present invention can furthermore contain one or more pigments in an amount totaling up to 15% by weight. Suitable pigments include, for example, Pigment Yellow 213, PY 151, PY 93, PY 83, Pigment Red 122, PR 168, PR 254, PR 179, Pigment Red 166, Pigment Red 48:2, Pigment Violet 19, Pigment Blue 15:1, Pigment Blue 15:3, Pigment Blue 15:4, Pigment Green 7, Pigment Green 36, Pigment Black 7, and Pigment White 6.

The inks used in the method of the present invention additionally contain the usual photoinitiators familiar to the person skilled in the art. The type and amount of the photoinitiators used is largely determined by the UV radiation used. The usual amount of photoinitiators used in the ink is from 1 to 5% by weight, based on the total weight of the ink. Other agents may also be added to the inks to adjust their properties, such as dispersing agents, defoamers and UV absorbers.

According to the present invention, the metal layers can, for example, contain chromium or aluminum.

Clear lacquers are coating materials that produce transparent layers or coatings on a surface to impart mainly protective properties thereto. The clear lacquers usually have no content of pigments or fillers. Soluble dyes or transparent pigments may be added if desired. In the coating systems of the present invention, the applied clear lacquer layer is a top layer designed to protect the underlying layers from mechanical damage and weathering. According to the present invention, the UV-curing clear lacquers can, for example, contain from 15 to 50% of oligomers and from 20 to 80% of reactive thinners, in each case, by weight, based on the total weight of the clear lacquer. The clear lacquers can, for example, contain from 25 to 50% of oligomer and, for example, from 30 to 50% of oligomer, by weight, based on the weight of the clear lacquer. Suitable oligomers include, for example, aliphatic and aromatic urethane acrylates, polyether acrylates, and epoxy acrylates, which acrylates can be monofunctional or polyfunctional, for example, difunctional, trifunctional to hexafunctional, and decafunctional. The clear lacquers can, for example, contain from 30 to 75% of reactive thinners and, for example, from 40 to 60% of monofunctional, difunctional and/or trifunctional reactive thinners, by weight, based on the weight of the clear lacquer. Suitable reactive diluents are, for example, dipropylene glycol, tripropylene glycol diacrylate, tetrahydrofurfuryl acrylate, isobornyl acrylate, and isodecyl acrylate.

The clear lacquers used in the method of the present invention also contain the usual photoinitiators as are known to the person skilled in the art. The type and amount of the photoinitiators used are determined largely by the UV radiation used. The photoinitiators usually have a content of from 1 to 5% by weight, based on the total weight of the clear lacquer used. Other additives can also be added to the clear lacquers to adjust their properties, such as dispersing agents, defoamers, and UV absorbers.

The coating systems of the present invention can, for example, be used for coating plastics surfaces and glass surfaces. Suitable materials are plastics such as normal ABS (copolymer of acrylonitrile, butadiene, and styrene), ABS-PC (copolymer of acrylonitrile, butadiene, and styrene containing polycarbonates), and melamine such as melamine laminates or melamine-faced materials. The coating system of the present invention makes it possible to decorate the metal layer without damaging the top layer so that no destabilization of the overall structure occurs. The coating system of the present invention thus exhibits resistance properties that satisfy the usual automotive specifications.

The following formulation serves as an example only and has no restrictive effect on the present invention. The present invention is also not limited to embodiments described herein; reference should be had to the appended claims.

EXAMPLE

| Ink | |
| --- | --- |
| Component | Amount [% by wt] |
| Oligomer | 10 |
| Reactive thinner | 75 |
| Pigment | 10 |
| Photoinitiator | 2 |
| Additive | 3 |

| Metal Layer |
| --- |
| Component |
| Chromium or aluminum |

| Clear Lacquer | |
| --- | --- |
| Component | Amount [% by wt] |
| Oligomer | 40 |
| Reactive thinner | 50 |
| Photoinitiator | 5 |
| Other additive | 5 |

What is claimed is:

1. A method for coating a surface of glass, the method consisting of:

applying at least one ink via an inkjet process to the surface of the glass or to at least one primer layer applied to the surface of the glass;

irradiating with UV radiation the at least one ink applied so as to cure the at least one ink and to form an ink-containing layer;

applying at least one metal layer consisting of chromium to the ink-containing layer via a Physical Vapor Deposition (PVD) procedure;

applying at least one clear lacquer to the at least one metal layer consisting of chromium as a top layer; and curing the at least one clear lacquer so as to form a clear lacquer layer, wherein, the top layer protects underlying layers from mechanical damage and weathering.

2. The method as recited in claim 1, wherein the at least one clear lacquer is cured by irradiating with UV radiation.

3. A method for coating a surface of a plastic, the method consisting of:

applying at least one ink via an inkjet process to the surface of the plastic or to at least one primer layer applied to the surface of the plastic;

irradiating with UV radiation the at least one ink applied so as to cure the at least one ink and to form an ink-containing layer;

applying at least one metal layer consisting of chromium to the ink-containing layer via a Physical Vapor Deposition (PVD) procedure;

applying at least one clear lacquer to the at least one metal layer consisting of chromium as a top layer; and curing the at least one clear lacquer so as to form a clear lacquer layer, wherein, the top layer protects underlying layers from mechanical damage and weathering, and the plastic is selected from acrylonitrile butadiene styrene (ABS) or acrylonitrile butadiene styrene containing polycarbonates (ABS-PC).

4. The method as recited in claim 3, wherein the at least one clear lacquer is cured by irradiating with UV radiation.

* * * * *